United States Patent
Pezeshki et al.

(10) Patent No.: US 6,771,855 B2
(45) Date of Patent: Aug. 3, 2004

(54) LASER AND FIBER COUPLING CONTROL

(75) Inventors: Bardia Pezeshki, Redwood City, CA (US); Jay Kubicky, Fremont, CA (US); Ed Val, Fremont, CA (US)

(73) Assignee: Santur Corporation, Fremont, CA (US)

( * ) Notice: Subject to any disclaimer, the term of this patent is extended or adjusted under 35 U.S.C. 154(b) by 248 days.

(21) Appl. No.: 10/002,703

(22) Filed: Oct. 30, 2001

(65) Prior Publication Data

US 2002/0085806 A1 Jul. 4, 2002

Related U.S. Application Data

(60) Provisional application No. 60/244,689, filed on Oct. 30, 2000, provisional application No. 60/244,738, filed on Oct. 30, 2000, provisional application No. 60/311,621, filed on Aug. 8, 2001, and provisional application No. 60/311,443, filed on Aug. 8, 2001.

(51) Int. Cl.[7] .............................................. G02B 6/28
(52) U.S. Cl. ............................. 385/31; 385/32; 385/39; 385/40
(58) Field of Search ............................ 359/31, 32, 39, 359/40, 24

(56) References Cited

U.S. PATENT DOCUMENTS

| | | |
|---|---|---|
| 3,924,937 A | 12/1975 | Munroe et al. |
| 4,317,611 A | 3/1982 | Petersen |
| 4,359,773 A | 11/1982 | Swartz et al. |
| 4,498,730 A | 2/1985 | Tanaka et al. |

(List continued on next page.)

FOREIGN PATENT DOCUMENTS

| | | |
|---|---|---|
| EP | 0924821 A1 | 6/1999 |
| FR | 2805092 | 8/2001 |
| JP | 56060088 | 5/1981 |
| JP | 11326707 | 11/1999 |

(List continued on next page.)

OTHER PUBLICATIONS

"Broadband Lightwave Sources and System", Gayton Photonics Ltd., http://www.infowin.org/ACTS/RUS/PROJECTS/ac065.htm, printed Oct. 17, 2000 (4 pages).
Dellunde, Jaume, "Laser diodes", http://www.geo=cities.com/jdellund/receng.htm, printed Aug. 8, 2001 (4 pages).

(List continued on next page.)

Primary Examiner—Mohammad Sikder
(74) Attorney, Agent, or Firm—Christie, Parker & Hale LLP

(57) ABSTRACT

One or more single mode waveguide devices are fiber coupled such that signals to an optical element affect the coupling of the waveguide device to an optical fiber. A number of systems and methods are disclosed to adjust the coupling of the waveguide device to the optical fiber. These include dithering the tunable optical element at different frequencies along differing axes and using a lock-in technique to derive an error signal for each degree of motion, using a beamsplitter to form a secondary image of the focused beam on a position-sensitive detector, the use of a chiseled fiber to generate reflections from the angled facets, using an additional laser for a secondary image, or obtaining a secondary image from an angled fiber or a parasitic reflection.

13 Claims, 15 Drawing Sheets

U.S. PATENT DOCUMENTS

| | | | |
|---|---|---|---|
| 4,820,899 A | | 4/1989 | Hikima et al. |
| 5,136,598 A | | 8/1992 | Weller et al. |
| 5,241,610 A | * | 8/1993 | Labiche et al. ............... 385/16 |
| 5,274,489 A | | 12/1993 | Smith et al. |
| 5,283,796 A | | 2/1994 | Fink |
| 5,289,485 A | | 2/1994 | Mooradian |
| 5,291,502 A | | 3/1994 | Pezeshki et al. |
| 5,378,330 A | | 1/1995 | Li et al. |
| 5,379,310 A | | 1/1995 | Papen et al. |
| 5,420,416 A | | 5/1995 | Iida et al. |
| 5,468,975 A | | 11/1995 | Valster |
| 5,491,576 A | | 2/1996 | Bergano |
| 5,504,609 A | | 4/1996 | Alexander et al. |
| 5,519,487 A | | 5/1996 | Atwood et al. |
| 5,550,850 A | | 8/1996 | Lee et al. |
| 5,612,968 A | | 3/1997 | Zah |
| 5,629,790 A | | 5/1997 | Neukermans et al. |
| 5,699,589 A | | 12/1997 | Ripley et al. |
| 5,715,047 A | | 2/1998 | Adamovsky |
| 5,771,253 A | | 6/1998 | Chang-Hasnain et al. |
| 5,777,763 A | | 7/1998 | Tomlinson, III |
| 5,784,183 A | | 7/1998 | Aoki et al. |
| 5,784,507 A | | 7/1998 | Holm-Kennedy et al. |
| 5,798,859 A | | 8/1998 | Colbourne et al. |
| 5,825,792 A | | 10/1998 | Villeneuve et al. |
| 5,882,468 A | | 3/1999 | Crockett et al. |
| 5,930,045 A | | 7/1999 | Shirasaki |
| 5,949,544 A | | 9/1999 | Manning |
| 5,953,359 A | | 9/1999 | Yamaguchi et al. |
| 5,959,750 A | | 9/1999 | Eskildsen et al. |
| 5,977,567 A | | 11/1999 | Verdiell |
| 5,993,544 A | | 11/1999 | Knauss et al. |
| 5,999,303 A | | 12/1999 | Drake |
| 5,999,545 A | | 12/1999 | Jeon et al. |
| 6,044,705 A | | 4/2000 | Neukermans et al. |
| 6,049,554 A | | 4/2000 | Lang et al. |
| 6,078,394 A | | 6/2000 | Wood |
| 6,091,537 A | | 7/2000 | Sun et al. |
| 6,133,615 A | | 10/2000 | Guckel et al. |
| 6,175,668 B1 | | 1/2001 | Borrelli et al. |
| 6,183,092 B1 | | 2/2001 | Troyer |
| 6,201,629 B1 | | 3/2001 | McClelland et al. |
| 6,212,151 B1 | | 4/2001 | Heanue et al. |
| 6,227,724 B1 | | 5/2001 | Verdiell |
| 6,229,639 B1 | * | 5/2001 | Ozarski et al. ............. 359/223 |
| 6,256,328 B1 | | 7/2001 | Delfyett et al. |
| 6,275,315 B1 | | 8/2001 | Park et al. |
| 6,275,317 B1 | | 8/2001 | Doerr et al. |
| 6,316,764 B2 | | 11/2001 | Heffner et al. |
| 6,327,063 B1 | | 12/2001 | Rockwell |
| 6,350,064 B2 | | 2/2002 | Mitsuda et al. |
| 6,352,376 B2 | | 3/2002 | Walters et al. |
| 6,434,175 B1 | * | 8/2002 | Zah ............................ 372/20 |
| 6,483,969 B1 | | 11/2002 | Yap et al. |
| 6,516,017 B1 | | 2/2003 | Matsumoto |
| 6,522,793 B1 | | 2/2003 | Szilagyi et al. |
| 6,594,045 B2 | * | 7/2003 | Liu ............................. 398/58 |
| 2001/0017876 A1 | | 8/2001 | Kner et al. |
| 2001/0036206 A1 | | 11/2001 | Jerman et al. |
| 2001/0050928 A1 | | 12/2001 | Cayrefourcq et al. |
| 2002/0064192 A1 | | 5/2002 | Missey et al. |
| 2002/0076480 A1 | | 6/2002 | Hsieh et al. |

FOREIGN PATENT DOCUMENTS

| | | |
|---|---|---|
| JP | 2002246699 | 8/2002 |
| WO | WO 95/13638 | 5/1995 |
| WO | WO 02/13343 A2 | 2/2002 |
| WO | WO 02/37069 A1 | 5/2002 |
| WO | WO 02/37621 A2 | 5/2002 |
| WO | WO 02/058197 A2 | 7/2002 |
| WO | WO 02/013343 A3 | 7/2003 |

OTHER PUBLICATIONS

Hunter, D.K., et al., "Guided wave optical switch architectures. Part 1. Space switching", International Journal of Optoelectronics, vol. 9, No. 6, 1994 (pp. 477–487).

Solgaard, O., et al., "Optoelectronic Packaging Using Silicon Surface–Micromachined Alignment Mirrors", IEEE Photonics Technology Letters, vol. 7, No. 1, 1995 (pp. 41–43) (4 pages total).

Li, G.P., et al., "16–Wavelength Gain–Coupled DFB Laser Array with Fine Tunability", IEEE Photonics Technology Letters, vol. 8, No. 1, Jan. 1996 (pp. 22–24).

Gordon, C., "Hybrid Mode–Locked DBR–laser", Multidisciplinary Optical Switching Technology Center, http://www.ece.ucsb.edu/MOST/33.html, (last updated Jan. 22, 1996), printed Aug. 5, 2001 (3 pages).

Daneman, M. J., et al., "Laser–to–Fiber Coupling Module Using a Micromachined Alignment Mirror", IEEE Photonics Technology Letters, vol. 8, No. 3, Mar. 1996 (pp. 396–398).

Wu, M., "Micromachining for Optical and Optoelectronic Systems", Proceedings of the IEEE vol. 85, No. 11 Nov. 1997 (pp. 1833, 1943–1952).

Jacques, S., "Phase conjugate mirror and diffraction grating yield stable, collimated, coherent, high–power diode laser.", Oregon Medical Laser Center Newsletter, http://omlc.ogi.edu/news/dec97/pclaser.html, printed Apr. 9, 2001, (2 pages).

Shirasaki, M., "Chromatic–Dispersion Compensator Using Virtually Imaged Phased Array", IEEE Photonics Technology Letters, vol. 9, No. 12, Dec. 1997 (pp. 1598–1600).

Kudo, K., et al., "Multiwavelength microarray semiconductor lasers", Electronics Letters, vol. 34, No. 21, Oct. 15, 1998, (pp. 2037–2039).

Kopka, P., et al., "Bistable 2x2 and Multistable 1x4 Micromechanical Fibre–optic Switches on Silicon", Micro Opto Electro Mechanical Systems, MOEMS 1999 (4 pages).

"(BW)(Oh–Marconi–Comm–2) Marconi Communications Announces World–Beating Commercial Tuneable Laser at Telecom '99", Press Release, http://www.businesswire.com/cgi–bin/ts_headline.sh?/bw.101199/192842212, Oct. 11, 1999, printed Oct. 17, 2000 (2 pages).

Maluf, N., "Optical switches", An Introduction to Microelectromechanical Systems Engineering, 2000, pp. 187–190 (3 pages).

Nakano, H., "Technological Trends of Optical Communication Devices for DWDM", NEC Device Technology International 2000, No. 59 (5 pages).

Liu, F., et al., "Cost–effective wavelength selectable light source using DFB fibre laser array", Electronics Letters, vol. 36, No. 7, Mar. 30, 2000, pp. 620–621, (3 pages).

Hunwicks, A., "Advancing the Optical Component", http://www.telecoms-mag.com/issues/200004/tci/advancing.html, Apr. 2000, printed Oct. 17, 2000 (6 pages).

Pezeshki, B., et al., "12nm tunable WDM source using an integrated laser array", Electronics Letters, vol. 36, No. 9, Apr. 27, 2000 (pp. 788–789).

Howe, P., "Light fantastic", digitalMASS at Boston.com, http://digitalmass.boston.com/news/daily/05/22/light_fantastic.html, printed Oct. 17, 2000 (5 pages).

Silverman, S., "Vcs beam big bucks at optics upstarts", Redherring.com, Oct. 9, 2000, http://www.redherring.com/vc/2000/1009/vc-optics100900.html?id=yahoo, printed Oct. 10, 2000 (5 pages).

International Search Report dated Nov. 1, 2002 for International Application No. PCT/US01/45691 and mailed Jan. 6, 2003 (3 pages).

International Search Report dated Jan. 21, 2003 for International Application No. PCT/US01/24969 and mailed Jan. 28, 2003 (3 pages).

* cited by examiner

LASER AND FIBER COUPLING CONTROL

CROSS-REFERENCE TO RELATED APPLICATIONS

This application claims the benefit of U.S. provisional application Nos. 60/244,689 filed Oct. 30, 2000, 60/244,738 filed Oct. 31, 2000, 60/311,621 filed Aug. 8, 2001, 60/311,443 filed Aug. 8, 2001 and U.S. provisional patent application entitled Error Signal For Fiber Coupling, application No. 60/340,975 filed Oct. 29, 2001, which are hereby incorporated by reference as if set forth in full herein.

BACKGROUND

The present invention relates generally to lasers and in particular to controlling fiber coupling between an array of lasers and an optical output.

Fiber coupling is often an essential but costly step in packaging various waveguide devices for telecommunication applications. On account of the very small optical modes in single mode waveguide devices, very tight submicron tolerances are often required in the packaging.

Generally, the devices are actively aligned. For example to fiber couple a telecommunication laser, the device is activated, and the optical power coupled to the fiber is monitored as the positions of the various optical elements in the package are varied. When the coupling is maximized, the optical elements are permanently fixed in position. The process is time consuming, costly, and often not very reproducible due to contraction in epoxies or thermal expansion of the components.

Furthermore, all the components in the package should be made absolutely immobile for the above procedure to maintain effectiveness over time. Any change in the position of the elements decreases the optical coupling. This makes hybrid integration of components with varying expansion coefficients very difficult. For example, to package a laser with a lithium niobate modulator, the laser uses hard solder for thermal heatsinking, while the modulator uses a soft epoxy that does not stress the crystal. The relative position of these devices will vary in the package due to the mismatch in the materials. Similarly, solders and epoxies tend to cause stress in the fiber, which affects yield and reliability and can cause birefringence in the fiber that influences the polarization of light in the core.

BRIEF SUMMARY OF THE INVENTION

The present invention provides adjustable optical coupling systems and methods. In one embodiment, a laser from an array of lasers is selected in which each laser emits light at different wavelengths. An optical path from the laser to an optical output is established such that light from the laser is transmitted into an optical output. The optical path established is adjusted to maximize output power of the emitted light into the optical output. In one aspect of the invention, a look-up table is established where the table has entries in which individual lasers in the laser array are each assigned an output power value and an entry in the look-up table that corresponds to the selected laser is identified. In another aspect of the invention, a look-up table is established where the table has entries in which individual lasers in the laser array are each assigned a predetermined output power value and associated with a predetermined location identified for the optical element. An entry in the look-up table that corresponds to the selected laser is identified.

In one embodiment, the system comprises an array of lasers, at least one optical element and an optical output such that light from a laser from the array of lasers is directed into the optical output by the at least one optical element. A controller is also coupled to the at least one optical element and configured to adjust the optical element to maximize output power of the light directed into the optical output. In one aspect of the invention, the system also comprises a plurality of photodetectors proximate the optical output. The controller is coupled to the plurality of photodetectors and is configured to adjust the optical element based on the information provided by the photodetectors. The information provided by the photodetector comprises optical output power of light received at one or more of the photodetector and/or a location of light incident upon one or more of the photodetectors. In another aspect of the invention, the controller generates an error signal to adjust the optical element.

In a further embodiment, the system comprises an array of lasers having lasers configured to emit light, an optical output configured to receive light and a detector near the optical output. The system also includes at least one optical element configured to receive light from a laser from the array of lasers and to direct a portion of the light to the optical output and a portion of light to the detector. A controller is coupled to the at least one optical element and configured to adjust the at least one optical element to maximize output power of the light directed into the optical output. In one aspect of the invention, the optical element comprises a beam splitter and/or a mirror.

In a further embodiment of the invention, the system commprises an array of lasers comprising a first laser and a second laser where the first laser is configured to emit light and the second laser is configured to emit light. An optical output is also provided and configured to receive light from the first laser. The detector near the optical output is configured to receive light from the second laser. Also, at least one optical element is provided and configured to receive light from the first and second lasers and a controller is coupled to the at least one optical element and configured to adjust the at least one optical element to maximize output power of the light into the optical output. In other aspects of the invention, the second laser is a predetermined distance from the first laser.

In another embodiment of the present invention, the system comprises emitting means for emitting light having differing wavelengths, output means, and optical means for directing light having a particular wavelength from the emitting means into the output means. Coupled to the optical means is control means that also adjusts the optical means to maximize power of the light directed into the output means. In another aspect of the invention, the system further comprises reflective means for reflecting light from the emitting means and directed to the output means. In another aspect of the invention, the system provides sensing means for sensing light and is proximate the output means. The control means is coupled to the sensning means and adjusts the optical means based on light sensed by the sensing means.

Many of the attendant features of this invention will be more readily appreciated as the same becomes better understood by reference to the following detailed description and considered in connection with the accompanying drawings.

DETAILED DESCRIPTION

Figure 1:
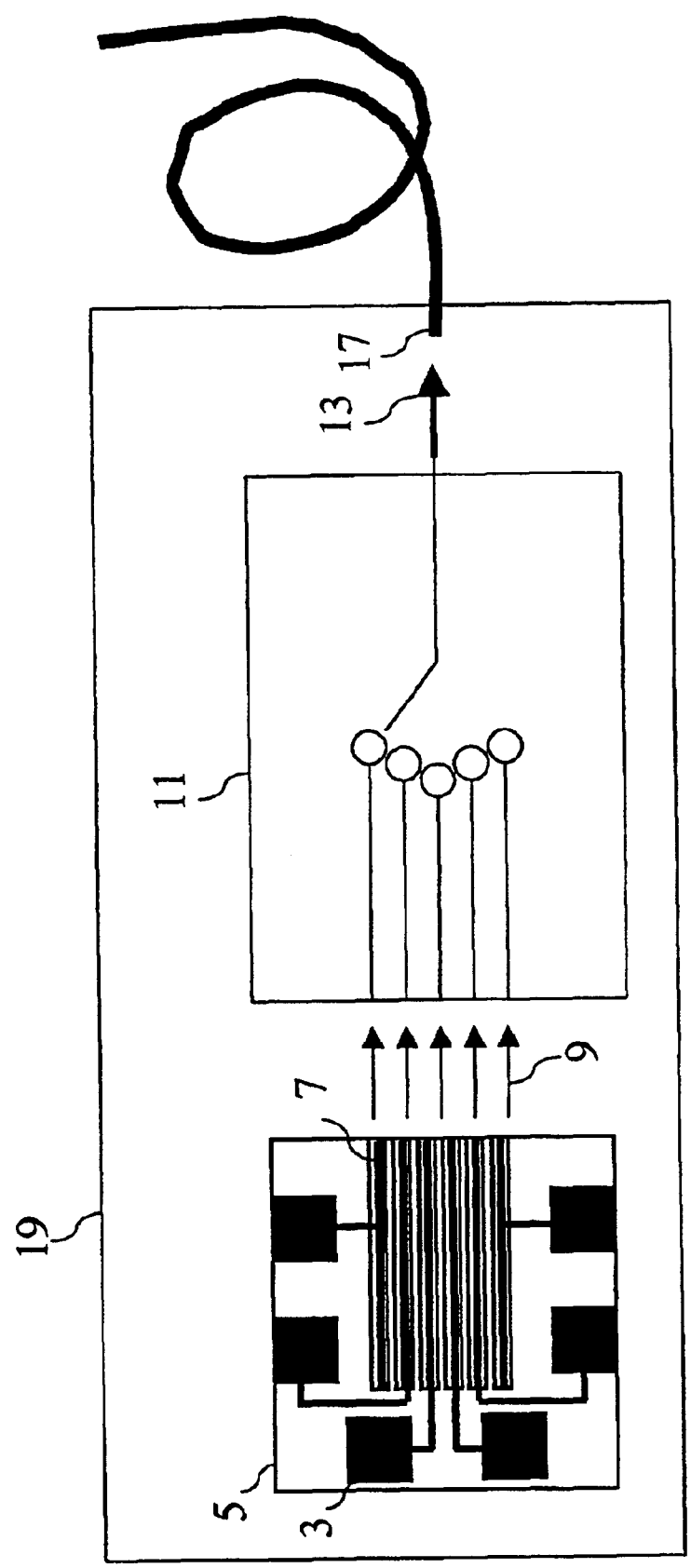
FIG. 1 illustrates one embodiment of an optical transmission apparatus having an individually addressable multi-wavelength laser array directly coupled to a 1:N micromechanical switch.

FIG. 1 shows an array of single frequency lasers, such as distributed feedback (DFB) lasers, on a semiconductor substrate. The array of lasers comprises a number of independently addressable lasers 7. Each laser has a separate contact pad 3 from which current is injected into the laser. Each laser is designed to operate at a different lasing wavelength, by, for example, varying the grating pitch in the laser or adjusting the effective index of the optical mode through varying the stripe width or the thickness of the layers that compose the laser. When current is injected into the laser using for example contact pads 3, the laser emits radiation with a specific wavelength and from a particular position on the chip, as represented by the arrows 9. In one embodiment, one laser is operated at a time, depending on the desired wavelength. The radiation or light from the lasers is transmitted to a micro-mechanical optical switch or switching element 11. The switching element has a number of states. In each particular state of a set of states, one of the input optical beams, i.e., light from one of the lasers, is transferred to the output 13 and transferred to the output fiber 15. The entire assembly is packaged together on one submount 19.

The fabrication of multi-wavelength laser arrays is relatively well known in the art. To assign different wavelengths to each laser, a number of techniques can be used, such as directly-written gratings with electron beam lithography, stepping a window mask during multiple holographic exposures, UV exposure through an appropriately fabricated phase mask, or changing the effective index of the mode of the lasers. Generally, for stable single mode characteristics, either a controlled phase shift is also included in the laser or gain/loss coupling is used in the grating. The wavelength of such lasers can be accurately controlled through dimensional variables, and varied across the array.

The lasers, switching element, and other components are more fully described in the commonly assigned patent application entitled Tunable Controlled Laser Array, filed on Oct. 30, 2001 the disclosure of which is incorporated by reference.

Figure 2:
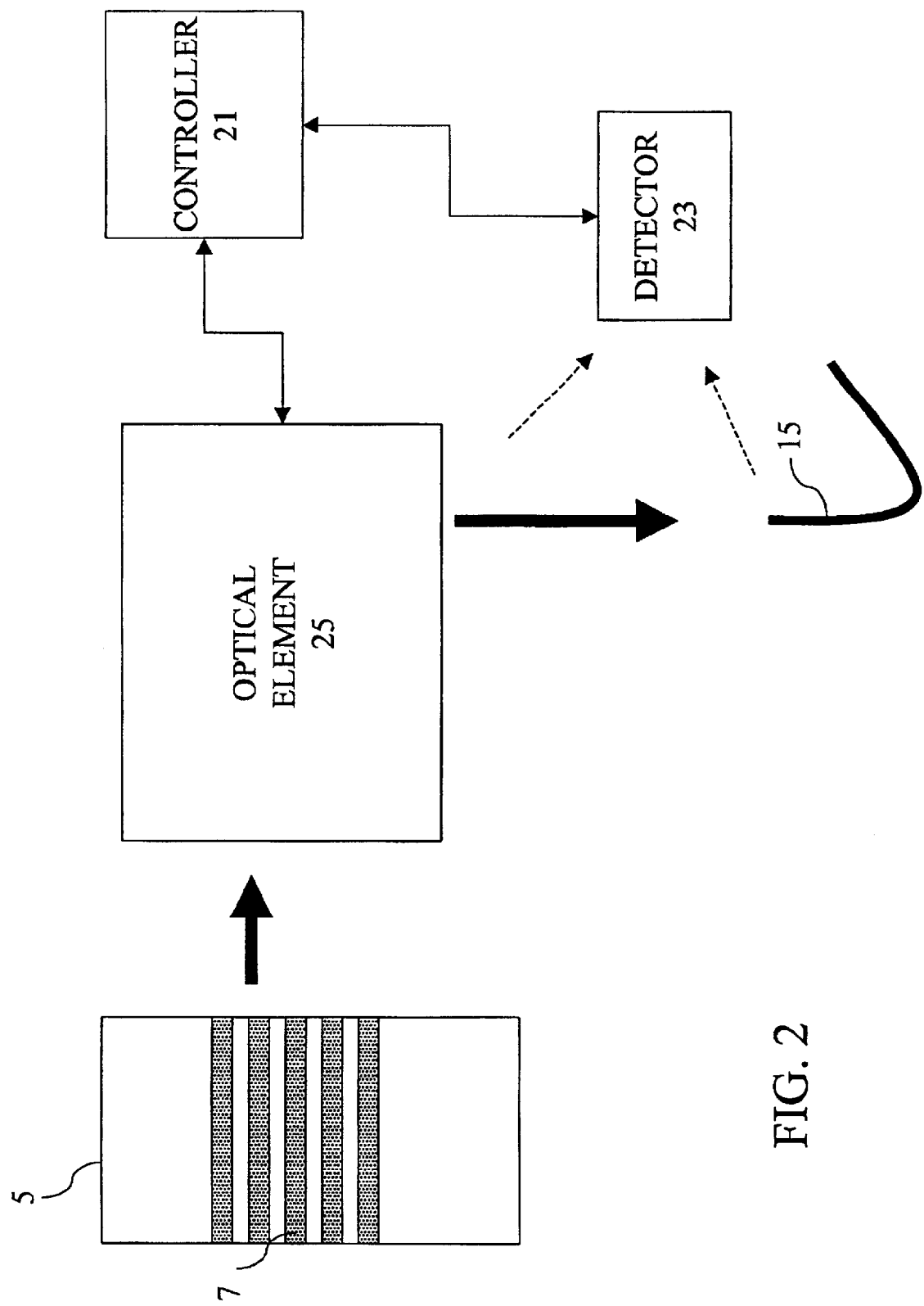
FIG. 2 illustrates one embodiment of an optical transmission apparatus with a control system.

One exemplary embodiment of the switching element 11 is shown in the system of FIG. 2. In the embodiment illustrated in FIG. 2, current is provided to a laser element of the laser array, e.g., laser element 7, and thereby the laser element emits light. The light from the laser element is then directed by an optical element 25 to an optical output, e.g., an optical fiber 15. The optical element, in one embodiment, is a moveable mirror. The optical element, in various other embodiments, is a combination of mirrors, lens, beam splitters or other types of stationary and/or movable optical components, such that light from any particular laser or one or more lasers is directed to the optical fiber. Additionally, the optical element, in various embodiments, directs light or a portion of the light to a detector 23. In other embodiments, the optical output provides light or a portion of the light to the detector.

Over time or due to certain conditions, e.g., thermal effects or packaging disturbances, the laser to fiber coupling arrangement may require alignment or adjustment.

A controller 21 with the detector 23 identifies and corrects for misalignments. The detector 23 senses, in various embodiments, a position of the light beam or a measure of the power of light beam at a predefined position. In one embodiment, the detector 23 determines the power of the light focused into the optical fiber. The controller receives the positional and/or power information from the detector, and determines if the fiber coupling arrangement should be adjusted. As such, the controller, in one embodiment, generates a signal used to adjust the fiber coupling arrangement. In one embodiment, the controller is a digital signal processor configured to receive and interpret power and/or positional information from the detector and to generate and issue adjustment commands to the optical element.

Figure 3:
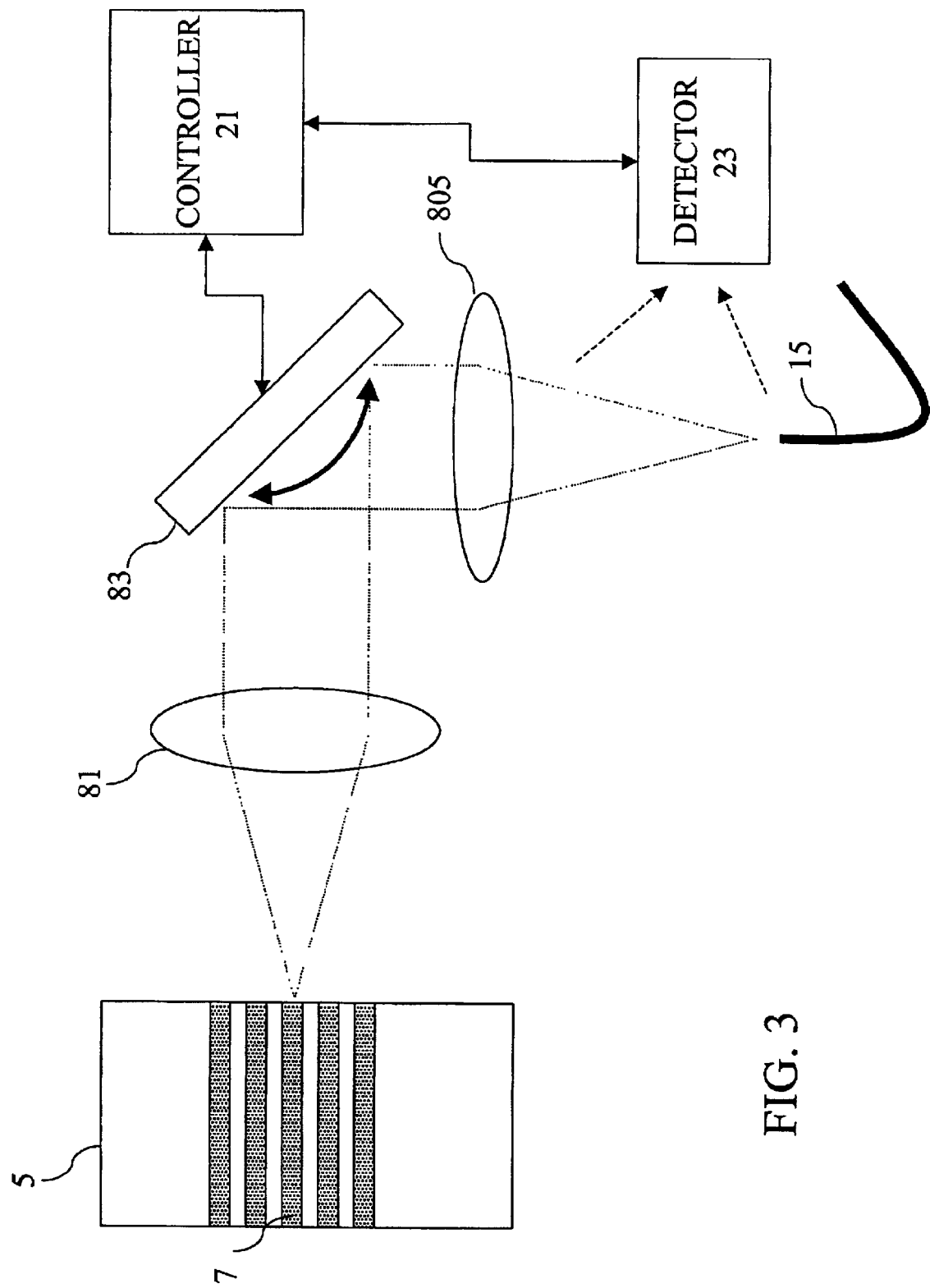
FIG. 3 illustrates another embodiment of an optical transmission apparatus in which light is provided to a fiber via a movable mirror being dynamically controlled.

In FIG. 3, one embodiment of an optical element of FIG. 2 is shown. The light from laser element 7 is collimated by a lens 81 and strikes a moveable mirror 83. The mirror reflects the light to a lens 805 which focuses the light into an optical output, e.g., an optical fiber 15.

The fabrication of micro-mechanical tip/tilt mirrors, such as the mirror 83, are well known in the art. Both surface micromachining techniques and bulk silicon etching have been used to make such mirrors. In general, the precision required for a mirror used with the present invention is considerably less than that of large cross connect switches, as the modes of the laser array are closely spaced. Thus, the pointing accuracy for the optical apparatus is considerably reduced.

In one embodiment, controller 21 consults a look-up table to determine an initial position of the mirror upon selection of a laser, and thereafter induces slight movement of the mirror to determine a preferred position. For instance, the controller maintains a lookup table of the mirror positions in conjunction with the selection of each of the lasers in the laser array. A detector sensing light from the mirror or the optical fiber provides a signal to the controller, the signal providing positional and/or power information regarding the light. Based on the values in the lookup table and the measurements performed by the detector, the controller determines which direction the mirror should be moved in order to provide optimal output power. Thus, as appropriate, the controller produces a control signal to move the mirror, for example, in a first or second direction. The second direction is a direction that is substantially opposite from the first direction. The mirror, in one embodiment, is continually commanded to wander and the output power monitored to compensate for movement of components of the package, thermal effects and other causes of potential misalignment and thereby provide maximum output power.

In a further embodiment, the controller determines if the positional and/or power information from the detector differs from a predetermined optimal positioning of the arrangement and/or a predefined maximum or optimal optical power of the light. Based on positional and/or power differences determined by the controller, the controller moves the mirror. For example, if the detector indicates that the light is at position X1, and the controller, by referring to the look-table, determines that the light should be at position Y1, the controller causes the mirror to move. As such, when the mirror is moved, the fiber coupling arrangement is adjusted. In other words, the mirror reflects the light from the laser and to the optical fiber, but to a different point or position. In this manner, the detector and controller measure the light to the optical fiber and adjust the mirror accordingly. Therefore, misalignments are corrected and optical power of the light at the optical fiber is maximized. Various embodiments of the detector determining the positional and/or power information regarding the light into the optical fiber and the controller adjusting the mirror or other optical elements is described in greater detail later.

Figure 4:
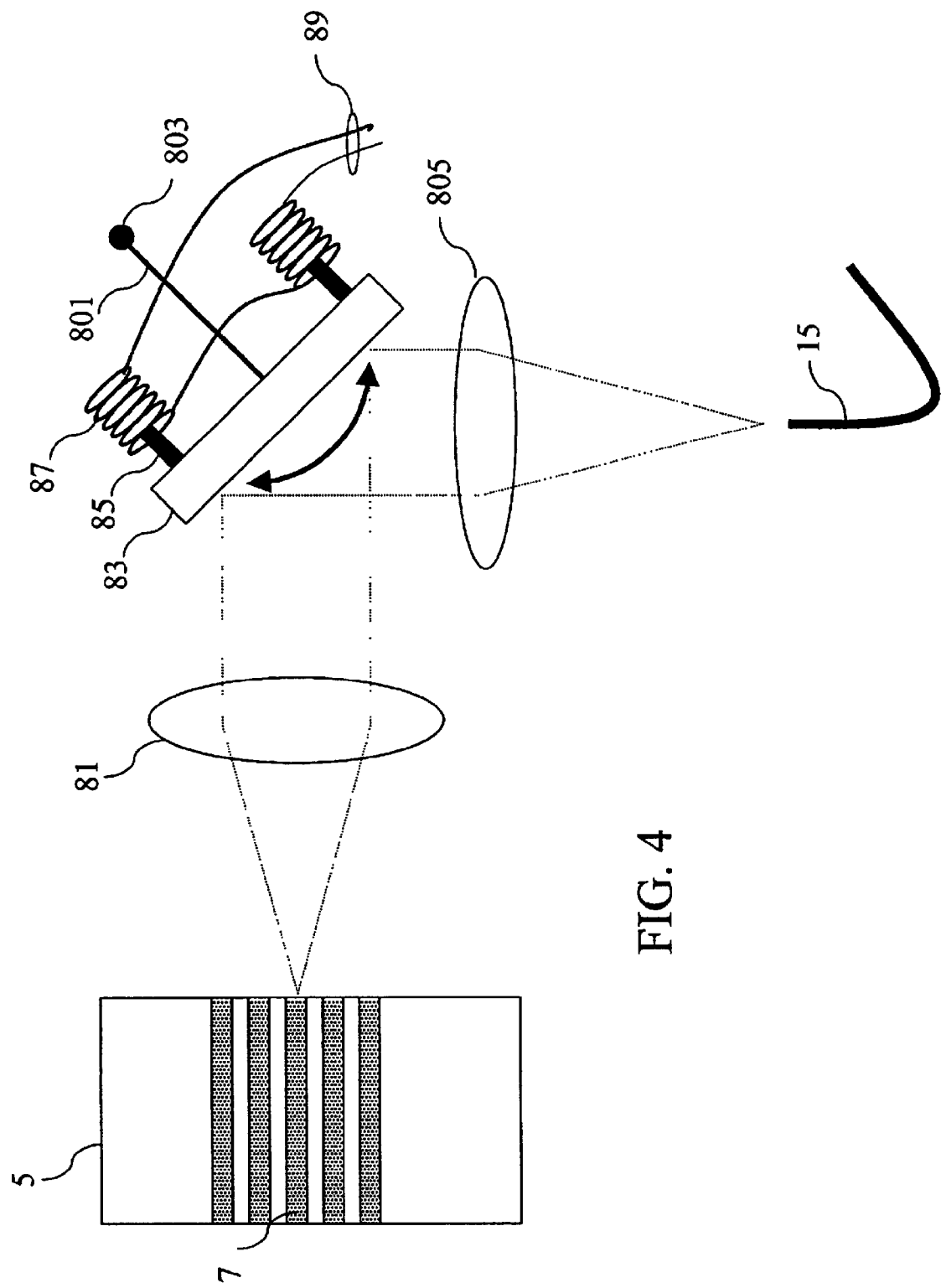
FIG. 4 illustrates one embodiment of an optical transmission apparatus with a magnetically movable mirror.

FIG. 4 shows a schematic of one embodiment of an optical system with a magnetically moveable mirror. In the diagram a laser array chip 5 comprises a number of different laser elements 7, each of which has a different set of characteristics. Depending on the system requirements, the light from one particular laser element is used and directed by the optical train to an output fiber 15.

In the particular embodiment illustrated in FIG. 4, the light from the laser element is collimated by a fixed focusing lens 81 and impinges on a mirror 83. Once reflected from the mirror, the light is focused by a second lens 805 and is coupled to the output fiber. In one embodiment, the collimating lens and the second lens are replaced by a single lens. The single lens is positioned approximately in the position of the collimating lens of FIG. 4, with the mirror located at the back focal plane of the lens.

The mirror's rotation angle is adjusted both to select the beam of a particular laser, and also to maintain the optimal coupling to the optical output. Two magnets 85 attached to the rear of the mirror are positioned within solenoids 87. Wires 89 are attached to the solenoids. A control current applied through the wires 89 controls the magnetic field which pulls one magnet into the solenoid and pushes the other magnet out. Together with a fixed pivot point 803 and a spring 801, the angle of the mirror is tuned, i.e., tilted, using the control current.

Figure 5:
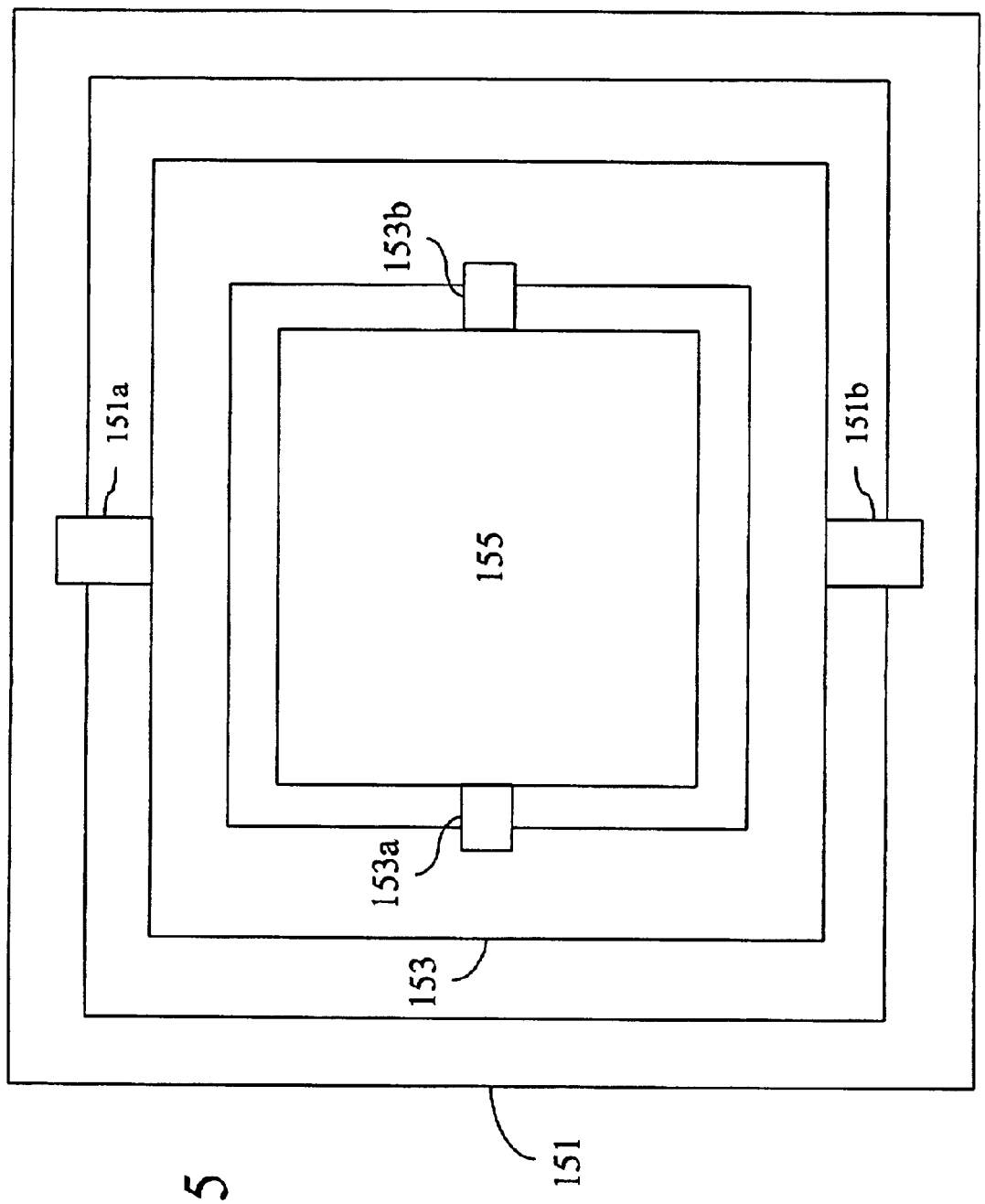
FIG. 5 illustrates one embodiment of an electrostatic movable mirror.

FIG. 5 illustrates another embodiment of a moveable mirror. The mirror has three sections, a first section 151, a second section 153 and a third section 155. The first section 151 is stationary and is coupled to the second section 153 via torsion hinges 151a and 151b. The second section rotates about torsion hinge 151a, i.e., about a first axis 157. The third section is coupled to the second section via torsion hinges 153a and 153b. As such, third section also rotates about the first axis when the second section rotates. Additionally, the third section rotates about the torsion hinges 153a and 153b, i.e., about a second axis 159. The third section is also coated with or is made of a reflective material so that light from a laser is reflected off the third section. By moving the section and third sections about the respective first and second axes, the mirror is able to direct light from a laser to a multitude of positions.

In one embodiment, portions of the sections are each plated or otherwise made conductive. From an external source (not shown), voltage is applied between the plated portions and a substrate below the mirror. As such, the portions act as capacitor plates and thus an electric field is generated. Through the interaction of the charge on the mirror and the electric field generated, a force is generated, such that the sections move or rotate. The amount of force generated is based on the distance or gap between the portions. In other embodiments, thermal actuators are used to position the mirror.

Figure 6:
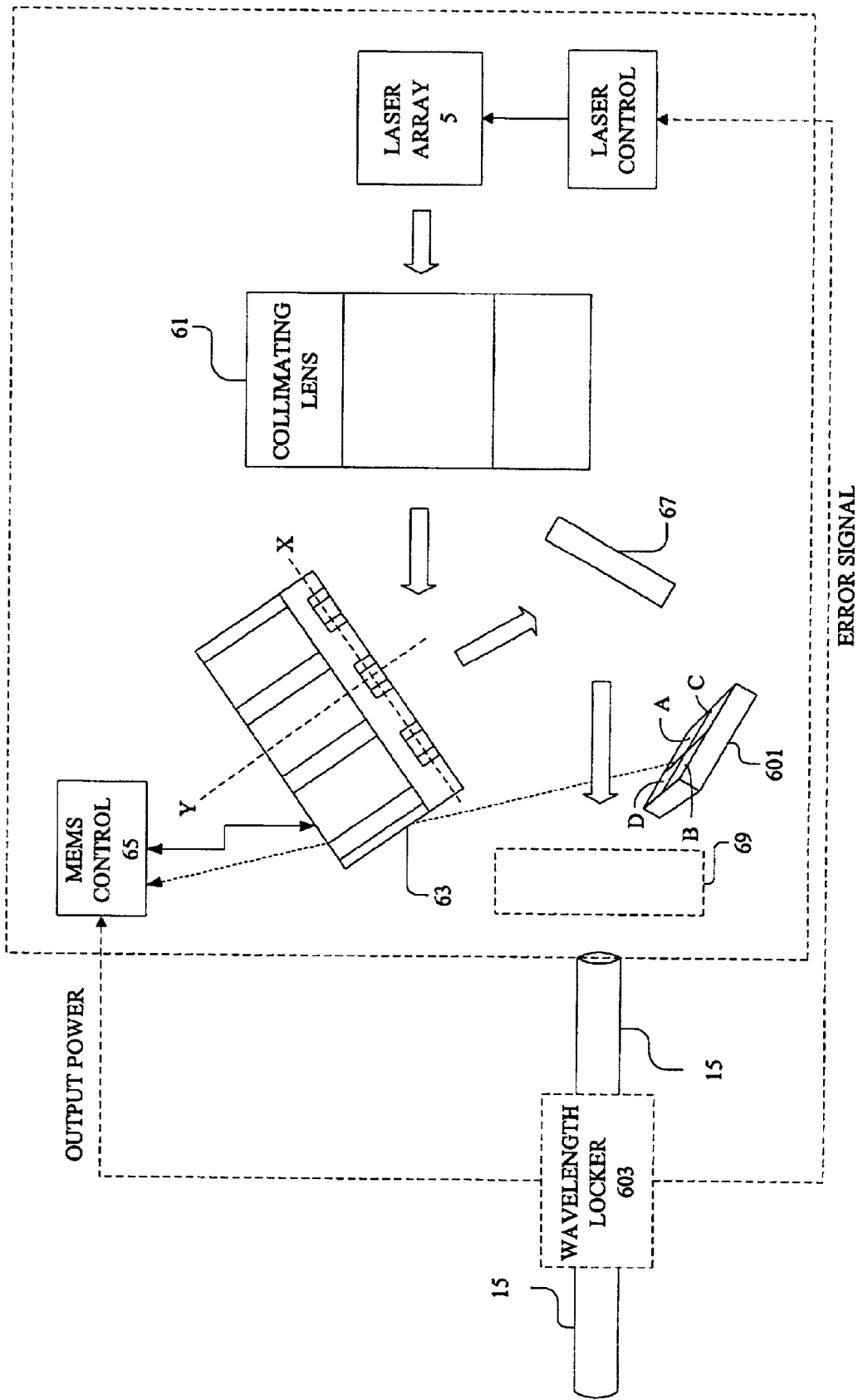
FIG. 6 illustrates one embodiment of an optical transmission apparatus with a control system.

FIG. 6 illustrates another embodiment of a control system in accordance with the present invention. An array of lasers 5 is formed on a substrate. In the embodiment described twelve lasers are provided, and each of the lasers produces light at a different wavelength, with the wavelengths centered around 1550 nanometers which is useful for fiber optic telecommunications. The lasers are distributed feedback (DFB) lasers, although in different embodiments the lasers are distributed Bragg reflector (DBR) lasers or vertical cavity surface emitting lasers (VCSELs). The VCSELs may be arranged linearly, as are the DFBs and DBRs in preferred embodiments, but the VCSELs are generally arranged in a two dimensional array.

Light from the lasers is passed through a collimating lens 61 and then to a moveable MEMS structure 63. As illustrated the MEMS structure is a two axis tilt mirror, such as described in U.S. Provisional Patent Application No. 60/309,669, entitled MEMS Mirror, filed Aug. 2, 2001, the disclosure of which is incorporated by reference. The mirror is moved via a MEMS control 65 by applying voltages to contact pads, resulting in rotation of the mirror in what for convenience will be described as the x and y axis. As illustrated, the light is then reflected from a second mirror 67 to a fiber 15. In alternative embodiments a prism is used to cause the light to reach the fiber. Using either the second mirror or the prism allows the laser and other components to be packaged in a butterfly package of the type generally used for laser light sources in telecommunications systems.

In various embodiments an optical isolator 69 is placed between the second mirror and the fiber. The optical isolator prevents, for example, stray reflections, from the end of the fiber or from discontinuities in the telecommunication's line, from returning to the laser. Also in various embodiments a modulator is placed after the optical isolator, or in its place, to modulate the light with an information signal.

In one embodiment a quad detector 601 is placed between the second mirror and the fiber. The light from the second mirror is reflected onto the quad detector which generates photocurrent in the four sections A, B, C and D. The ratio of these currents are stored and used for maintaining alignment. For instance, the ratio of the currents generated in sections A and B of the quad detector are measured and stored. Also, the ratio of the currents generated in sections C and D of the quad detector are measured and stored. An electronic control loop is then configured to maintain these ratios during the operation of the device. When the device is first packaged, a calibration procedure is performed in which the currents to the different sections of the quad detector are measured when the beam is optimally aligned. These current values are stored and used in the operation of the device. By operating the MEMs mirror in a feedback loop to keep the ratios of these currents the same, the optical beam will point in the same direction and thus maximum fiber coupling will be maintained. In one embodiment, generated photocurrents are provided to the MEMS control 65. Based on the generated photocurrents, the MEMS control produces an x axis control signal and a y axis control signal. Using these control signals or a signal or signals representative thereof the MEMS control positions the mirror.

In other embodiments, the quad detector is placed behind the second mirror or a third mirror is provided to direct light to the quad detector. Various operation and placement of the quad detectors and photodetectors relative to the other components in the package are also discussed, for example, in U.S. Provisional Patent Application No. 60/244,789, the disclosure of which is incorporated by reference.

In one embodiment, external to the package is an optional wavelength locker 603. As illustrated, the wavelength locker is an inline wavelength locker, although in various embodiments the wavelength locker is connected to the fiber by a tap. The wavelength locker illustrated in FIG. 6 determines the strength of light at two wavelengths about a selected wavelength. This is done, for example, by reflecting a portion of the transmitted light to two photodetectors. The transmitted light to a first of the photodetectors is of a wavelength slightly below the selected wavelength. The transmitted light to a second of the photodetectors is of a wavelength slightly above the selected wavelength. Various wavelength lockers are known to those of skill in the art.

Generally, a wavelength error signal is formed using the ratio of the output of the two photodetectors. For example, the output of the first photodetector may considered as forming the numerator, and the output of the second photodetector may be considered as forming the denominator. In such a circumstance, it may be seen that if the wavelength is too high the ratio will decrease, and if the wavelength is too low the ratio will decrease. Formation of the ratio, or a signal indicative of the ratio, may be accomplished using comparators, differential amplifiers, calculation by a microprocessor (following analog-to-digital conversion), or the like. The wavelength error signal is used for slight adjustments to the wavelength of the laser, using for example temperature tuning, particularly for DFB lasers, or charge injection for DBR lasers.

In the embodiment described the output of the photodetectors in the wavelength locker is also used as an indication of output power from the laser. The output of the photodetectors, for example, is summed by a summer. The output of the summer is an output power indicator, and is provided to a control element. The control element produces a x axis control signal and a y axis control signal using the control signal, or a signal or signals representative thereof. The x axis control signal and the y axis control signal is used to position the mirror.

In one embodiment the control element maintains a lookup table of mirror positions for selection of each of the twelve lasers. The lookup table is populated, in one embodiment, at the time of manufacture of the package. On receipt of a command to select a particular laser, the control element reads the appropriate values from the lookup table and generates the corresponding x axis control signal and y axis control signal.

Due to movement of components of the package, thermal effects, and other causes of potential misalignment, the control signals generated using the lookup table may not appropriately position the mirror. Accordingly, in one embodiment the mirror position is commanded to wander slightly, with the output power indicator monitored to determine the mirror position providing maximum output power.

In another embodiment, the light from a tap on the fiber is provided to a photodetector. The photodetector produces a signal that is proportional to the output power of the light from the tap and is provided to the controller. The controller adjusts the mirror based on previous signals provided by the wavelength locker or an initial calibration.

Figure 7:
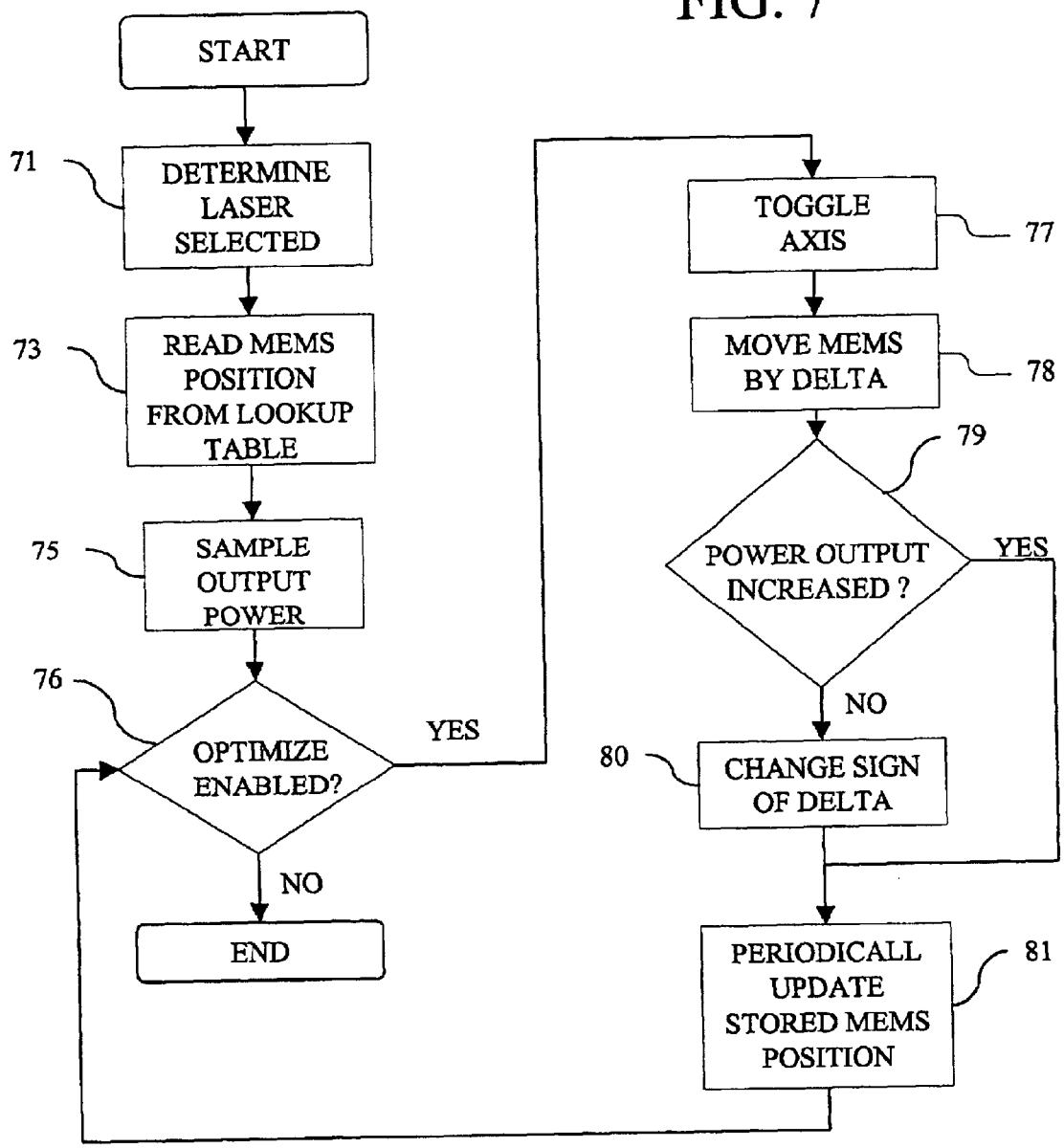
FIG. 7 illustrates a flow diagram of one embodiment of adjusting an optical element to maximize fiber coupled power.

A flow diagram of a process for determining position of the mirror is provided in FIG. 7. In Block 71 the process determines a selected laser based on a laser select command. In Block 73 the process determines the appropriate control signals using a lookup table of expected mirror positions for selected lasers. In Block 75 the process samples the power output indicator and stores the result as an initial result.

In Block 76 the process determines if the laser/fiber coupling position should be optimized. It may be desirable to interrupt the optimization process occasionally (e.g., when switching between lasers).

In Block 77, the process alternates between, the first and second axes, e.g., the X and Y axes. Each axis position is optimized alternately to ensure that an optimal position is maintained for both axes. In Block 78 the optical element, e.g., the MEMS, is moved by a value of DELTA, which is appropriately chosen for each axis according to the current position of the MEMS. In one embodiment, the value of DELTA is determined from a function of the MEMS position and an amount voltage used to move the MEMS, such that smaller values of DELTA are used for larger MEMS voltages.

In Block 79 the process again samples the power output indicator and compares the result with the initial or previous output power value. If the comparison indicates a greater output power at the new position of the MEMS, the process replaces the x axis position in the lookup table with the new position in Block 81. If the comparison indicates less output power at the new position, the process commands the mirror to move to another position by a slight amount in a direction opposite the previous direction. The process then samples the output power indicator and compares the result with the initial result. If the comparison indicates a greater output power at the new position, the process replaces the x axis position in the lookup table with the new position in Block 701.

Blocks 77 through 81 are repeated for the y axis, with the offsets being in a second direction and a direction opposition the second direction. The process then returns to Block 77, unless Blocks 77 through 80 indicate a position of maximum power is attained. If the new position results in a lower power, the direction of movement of the MEMS is reversed, e.g., by changing the sign of DELTA, and repeating the loop. In Block 81, the initial position is periodically updated in the lookup table using the current position.

In one embodiment, however, the process repeats until a new laser, or no laser, is selected. Continually repeating the process is beneficial, for example, if thermal or other effects result in displacement of some or all of the system components. In addition, at initial laser selection, or whenever the wavelength of the laser is being adjusted, deviations in the outputs of the photodetectors may be observed. Accordingly, in one embodiment mirror positioning is not accomplished if the ratio of the photodetector signals is outside a predefined limit. In another embodiment, mirror positioning as described above is first accomplished. Subsequently, the wavelength of the laser is adjusted and deviations in the outputs of the photodetectors are observed.

In yet a further embodiment, the amount of movement of the mirror during alignment is reduced as the process repeats. This allows, for example, for finer adjustment of the mirror position over time, and also helps avoid limiting the mirror position to sub-optimal locations.

Figure 8:
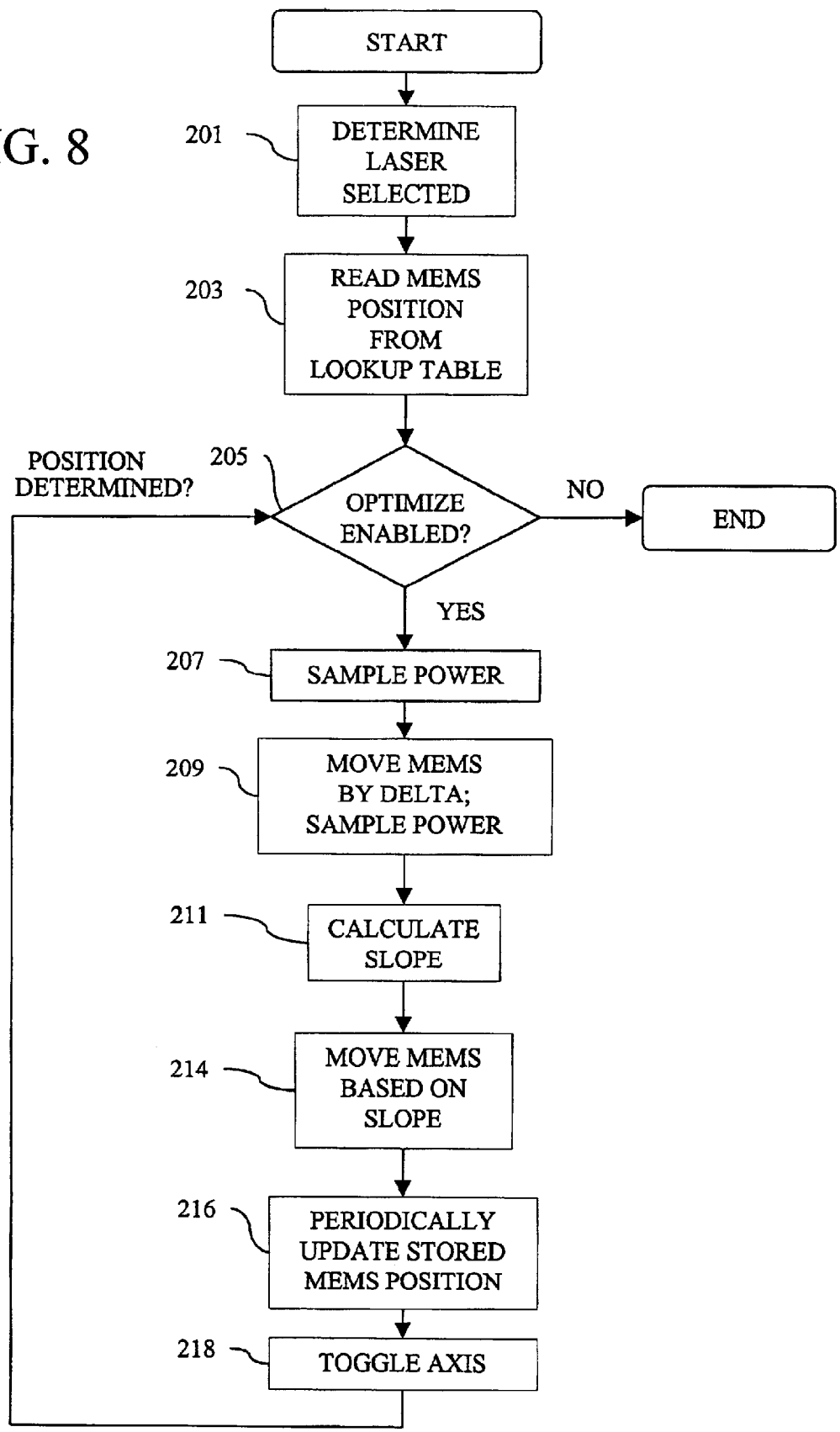
FIG. 8 illustrates a flow diagram of one embodiment of adjusting an optical element to maximize fiber coupled power.

A flow diagram of another embodiment of the process for determining position of the mirror is provided in FIG. 8. In block 201 the process determines a selected laser based on a laser select command. In block 203 the process using a lookup table determines the expected or initial mirror positions for the selected laser. In block 205 the process determines if the laser/fiber coupling position should be optimized. It may be desirable to interrupt the optimization process occasionally (i.e. when switching between lasers).

In block 207 the process samples the power output indicator and stores the result as an initial result.

In block 209 the optical element, e.g., the MEMS, is moved in a selected axis by a value of DELTA and the power output is sampled again. In block 211 the process calculates the slope of a power function by determining the change in the power output, i.e., the sampled power output in block 209 minus the initial result obtained in block 207, over the change in the position or location of the mirror in the first direction. In one embodiment, the MEMS position is updated and the MEMS is moved in block 214 by changing the current location by the calculated slope multiplied by a change factor.

In Block 216, the initial position is periodically updated in the lookup table using the updated position of the MEMS determined in block 214. In Block 218, the process switches to the other axis, i.e., alternates between the X and Y axes. As such, each axis position is optimized alternately to ensure the optimal position is maintained for both axes.

In one embodiment, however, the process repeats until a new laser, or no laser, is selected. In yet a further embodiment, the amount of movement of the mirror during alignment is reduced as the process repeats. This allows, for example, for finer adjustment of the mirror position over time, and also helps avoid limiting the mirror position to sub-optimal locations.

In another embodiment, predetermined positions of the mirror for the x and y axis and the power output of the laser selected are provided. In a further embodiment, the process determines the power output relative to positions in both the x and y axis. In either embodiment, the process determines or approximates a power function that relates power output to the positions of the mirror in the x and y axis.

For example, a tangent plane is determined in which the slope of the power function relative to the position of the mirror in the x direction and the slope of the power function relative to the position of the mirror in the y direction is determined for a specific position of the mirror in the x and y axis, i.e., the point of tangency of the function. From the calculated function a local maximum is determined, i.e., where the power output is greatest and is neither increasing or decreasing at a specific position of the mirror in the x and y axis. In other words, the derivative of the power function is 0 in every direction. In one embodiment, the local maximum determined is set as the initial start conditions or position of the mirror in the x and y axis in which maximum power output for the selected laser is obtained. The process in FIG. 7 is then used to confirm that this maximum power output point has not changed due to an error condition, such as movement of components of the package, thermal effects, etc.

Figure 9:
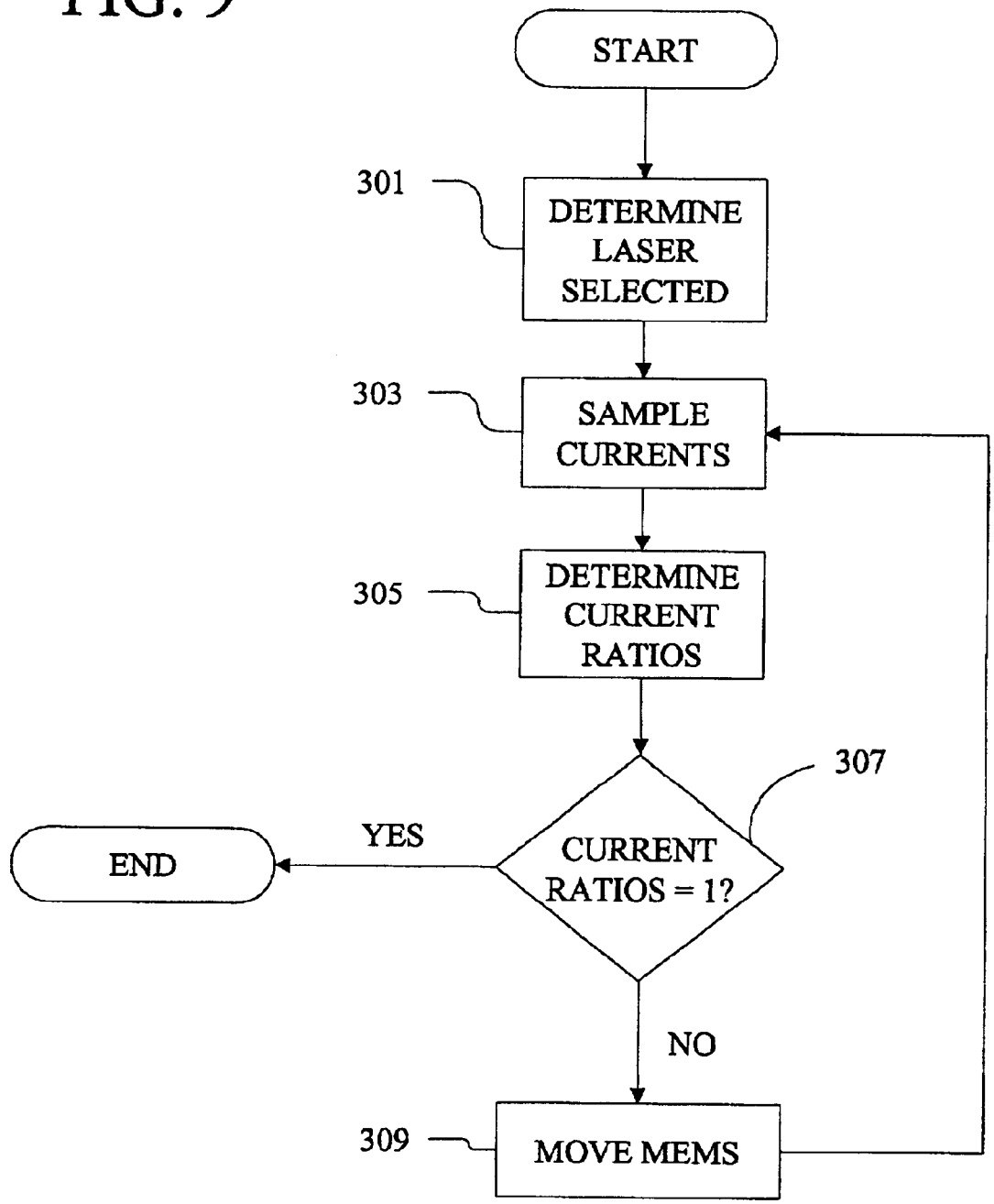
FIG. 9 illustrates a flow diagram of one embodiment of adjusting an optical path to maximize fiber coupled power.

A flow diagram of one embodiment of the process for determining position of the mirror using a quad detector is provided in FIG. 9. In block 301 the process determines a selected laser based on a laser select command. In block 303 the process samples the currents generated from each section A, B, C and D of the quad detector. In block 305 the process calculates ratios of the currents from of one section relative to another section. For example, in one embodiment, a first ratio (the current from section A over the current from section B) and a second ratio (the current from section C over the current from section D) are calculated. Various other embodiments of the first and second ratios, such as the current from section D over the current from section A, additional ratios, such as a third ratio (the current from section B over the section C) and any combination thereof may be provided.

In block 307 the process analyzes the ratios in relation to the position of the mirrors. In other words, if the process in block 307 determines that the first and second ratios are not equal to one, the process in block 309 moves the mirror using a control signal. If the first ratio is greater than one, the process moves the mirror along the x axis by a predetermined amount in a first direction. Alternatively, if the first ratio is less than one, the process moves the mirror along the x axis by a predetermined amount in a direction opposite of the first direction. If the first ratio is equal to one, but the second ratio is greater than one, then the process moves the mirror along the x axis by a predetermined amount in a first direction. Alternatively, if the second ratio is less than one, the process moves the mirror along the x axis by a predetermined amount in a direction opposite of the first direction. The amount of movement is related to how much the measured ratio is different from the ideal ratio. The process is then repeated continuing to block 303 sampling the currents from the quad detector. However, if in block 307 the process determines that the first and second ratios are equal to one, the process ends. The process is also repeated starting from block 303 for the y axis with the movement of the mirror along the y axis being in a second direction and a direction which is opposite to the second direction. In one embodiment, the ratio corresponds to a value determined during an initial calibration.

In one embodiment, however, the process repeats until a new laser, or no laser, is selected. In yet a further embodiment, the amount of movement of the mirror during alignment is reduced as the process repeats. This allows, for example, for finer adjustment of the mirror position over time, and also helps avoid limiting the mirror position to suboptimal locations.

In one embodiment, initially, the process using a lookup table determines the expected or initial mirror positions for the selected laser. This lookup table is generated specifically for the device in an initial calibration procedure after the laser is packaged. In another embodiment, a predetermined relationship between a section or sections of the quad detector and the position of the MEMS structure is provided. For example, more light on section A and thus more current from section A indicates that the mirror should be moved along the x axis in a first direction. Using the first example and the first ratio describe above, the process then in block 307 would recognize that the MEMS is to be moved in the first direction in block 309 if the first ratio is greater than one. In another example, more light on section D and thus more current from section D indicates that the mirror should be moved along the y axis in a second direction. Using this example and the second ratio describe above, the process then in block 307 would recognize that the MEMS is to be moved in the second direction in block 309 if the second ratio is less than one. As such, in this embodiment, if a relationship between the currents from the sections and the movement of the MEMS for the x and y axis is predetermined, the process does not need to be repeated for the y axis.

Figure 10:
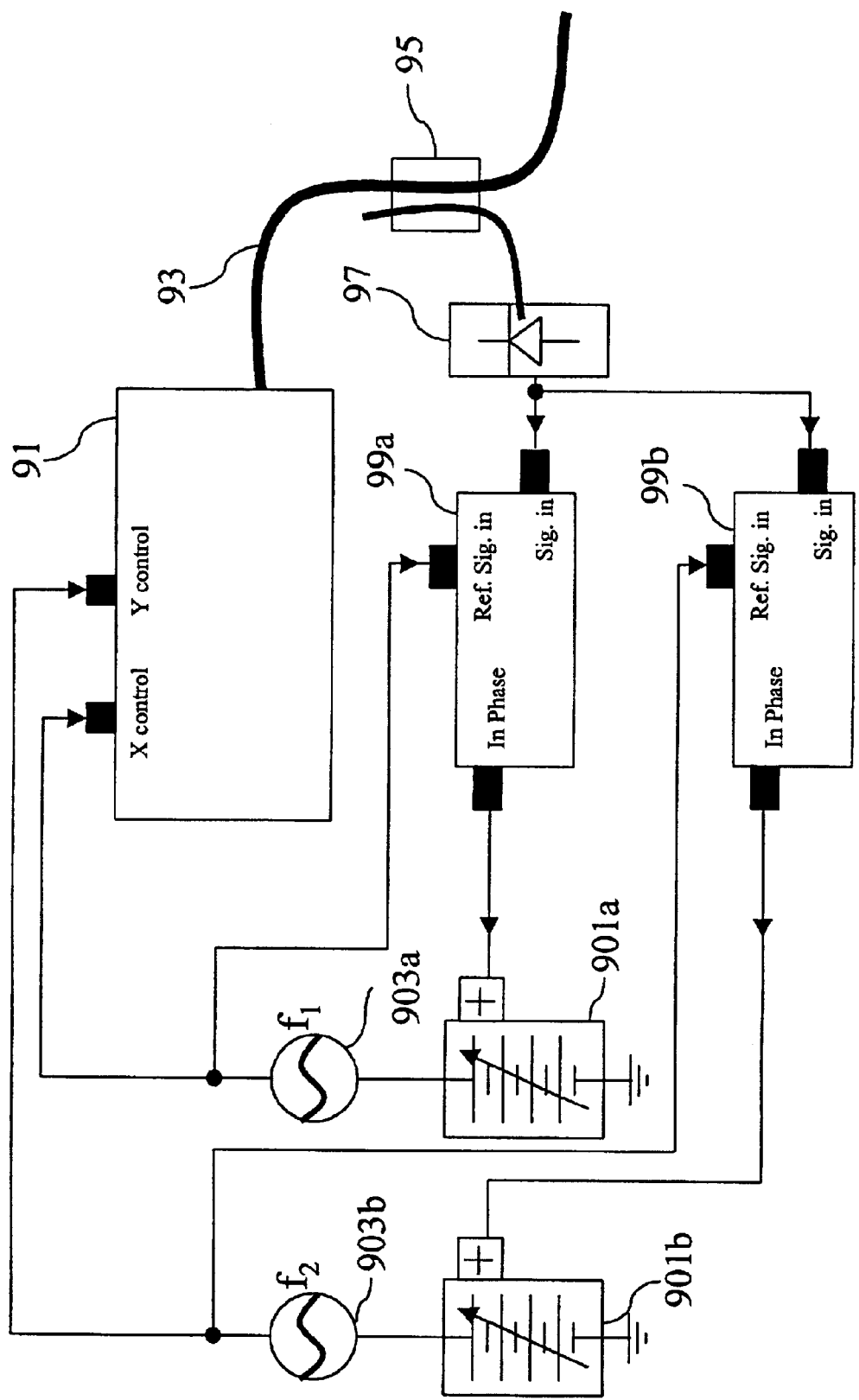
FIG. 10 illustrates a dithering control system and capable of controlling various embodiments of an optical transmission apparatus.

A schematic for one embodiment of two axis control of an optical apparatus 91 is shown in FIG. 10. The optical system has two controls to maintain coupling, labeled X and Y on the diagram. The controls correspond to an electronic control of position, such as described in reference to the previous figure. For example, the x-control determines the rotation of a tilt mirror in the x-axis, while the y-control determines the rotation of the tilt mirror in the y-axis.

As illustrated in FIG. 10, an optical output of the unit is coupled to a fiber 93. Some of the power is monitored through a tap 95 provides a signal to a photodetector 97. The higher the coupled optical power, the greater the signal produced by the photodetector. The electrical signal produced by the photodetector is provided to two phase lock loops or lock-in amplifiers 99a and 99b. These measure the sinusoidal components present in an input signal at a frequency corresponding to a reference input signal and generate a signal whose magnitude corresponds to the in-phase component of the input signal compared to the reference input signal. For example, if the sinusoidal component of the input signal is in phase with the reference signal, an in-phase output of the lock-in amplifier would be positive, while if the input signal is out-of-phase with the reference signal, the in-phase output would be negative.

The output of the lock-in amplifier is then provided to a respective variable signal source 901a and/or 901b, where it is integrated to generate a DC signal. The DC signal is added to a sinusoidal AC source 903a and/or 903b, and the combination is fed to the appropriate control input of the optical system.

For two axis control, the AC sources for the x and y axes operate at two different frequencies $f_1$ and $f_2$. If the positive cycle of the dithering AC signal improves the optical coupling, then the DC signal will increase to improve the output power, while if the positive cycle reduces the coupling, then the DC signal will decrease. The operation of such a control loop falls under the domain of feedback analysis, and the timing and stability can be easily calculated. Additionally, the DC signals in various embodiments, are used to monitor the degradation of the package's fiber coupling and/or be used to warn of an impending failure. This is in contrast to conventional monitor photodiodes in laser packages which monitor only the health of the laser chip itself and not the fiber coupled power, which requires a costly external tap.

For telecom applications, such dithered signals may not be an important issue. For example, in 2.5 Gb/s communications (OC48), the communication link generally has a low-pass cut-off of about 70 MHz. Thus low frequency oscillations on the output signal should not lead to significant errors in the data communication. Since the timing for the servo loop is ultimately limited by the mechanical time constants of the transducer, the dithering frequencies and the response time of the loop is far slower then the low pass cut-off frequency.

An alternative method of dithering that does not depend on phase locked loops or two different dithering frequencies, as described above, is to directly tilt the beam in other directions and monitor improvements or changes in fiber coupled power. For example, if the lookup table indicates that previously the optical position for the mirror was at an x voltage of 100 V and a y voltage of 50 volts, the microprocessor determines and utilizes five points (100, 50), (100.1, 50), (99.9, 50), (100, 50.1), and (100, 49.9), and then takes the point with the highest power for the next iteration. In one embodiment, the alternative method is performed by a fast microprocessor in a telecommunication system having a good signal to noise ratio.

Figure 11:
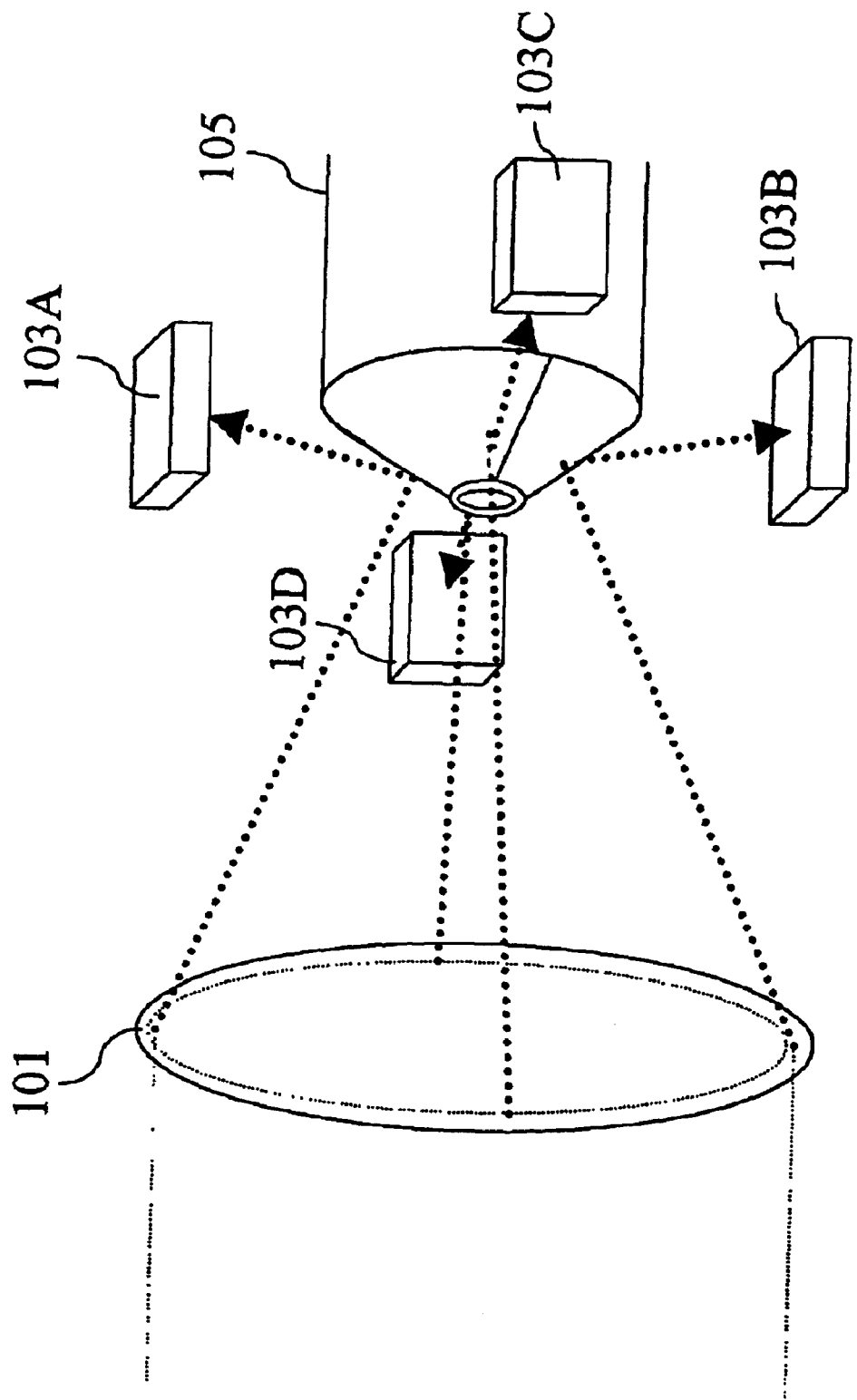
FIG. 11 illustrates one embodiment of a control system using a chiseled fiber and capable of controlling various embodiments of an optical transmission apparatus.

However, in many applications, having a dithered signal on the output is not acceptable, or splicing an appropriate tap on the output fiber may be prohibitive. In such cases an alternate method of generating an error signal for the control loop is used. One method is described below in reference to one embodiment of a fiber arrangement shown in FIG. 11. In place of a standard cleaved fiber, a chiseled fiber is used. Such fibers are readily built by a number of suppliers. The fiber 105 has a flat section where a single mode region is contained, but has sloping sidewalls. When the light is focused by lens 101 on the core, some of the light at the edges of the beam is incident on the sloping sidewalls and is reflected around the fiber. There are four photodetectors placed on the periphery of the fiber, photodetector 103A is above the fiber, 103B below, 103C to the right and 103D to the left.

In the initial packaging stage, the electronic control is varied to optimize the coupling to the fiber. When this optimal packaging condition is achieved, the ratio of the optical power falling on the vertical detectors (power incident on photodectector 103A divided by the power falling on photodetector 103B) and on the horizontal detectors (power on the photodetector 103C divided by the power falling on the photodetector 103D) is measured and the value stored. An electronic control loop, such as that described in FIG. 9, is then configured to maintain these ratios during the operation of the device.

For example, if a different laser is selected, the electronic control loop adjusts to once again achieve these ratios. By using two photodetectors for each axis, an error signal independent of the optical power can be obtained. In another embodiment, three photodetectors are used along with a more complex control circuitry. For example, in FIG. 11, photodetector 103A can be left out. Lateral control is achieved by adjusting the ratio between the detected signal from photodetectors 103C and 103D, while vertical control is achieved by adjusting the ratio between a detected signal at photodetector 103B and the sum of detected signals from photodetectors 103C and 103D. The embodiment of FIG. 11 can also be combined with the dither approach mentioned previously, with in varying embodiments differing numbers of detectors being used. In one embodiment, a single detector provides an adequate feedback signal, with maximum coupling to the fiber occurring when the least amount of light hits the sloped sides and scatters out. As such, with a single detector, by minimizing the amount of scattered light, maximum coupling to the fiber can be achieved.

Figure 12:
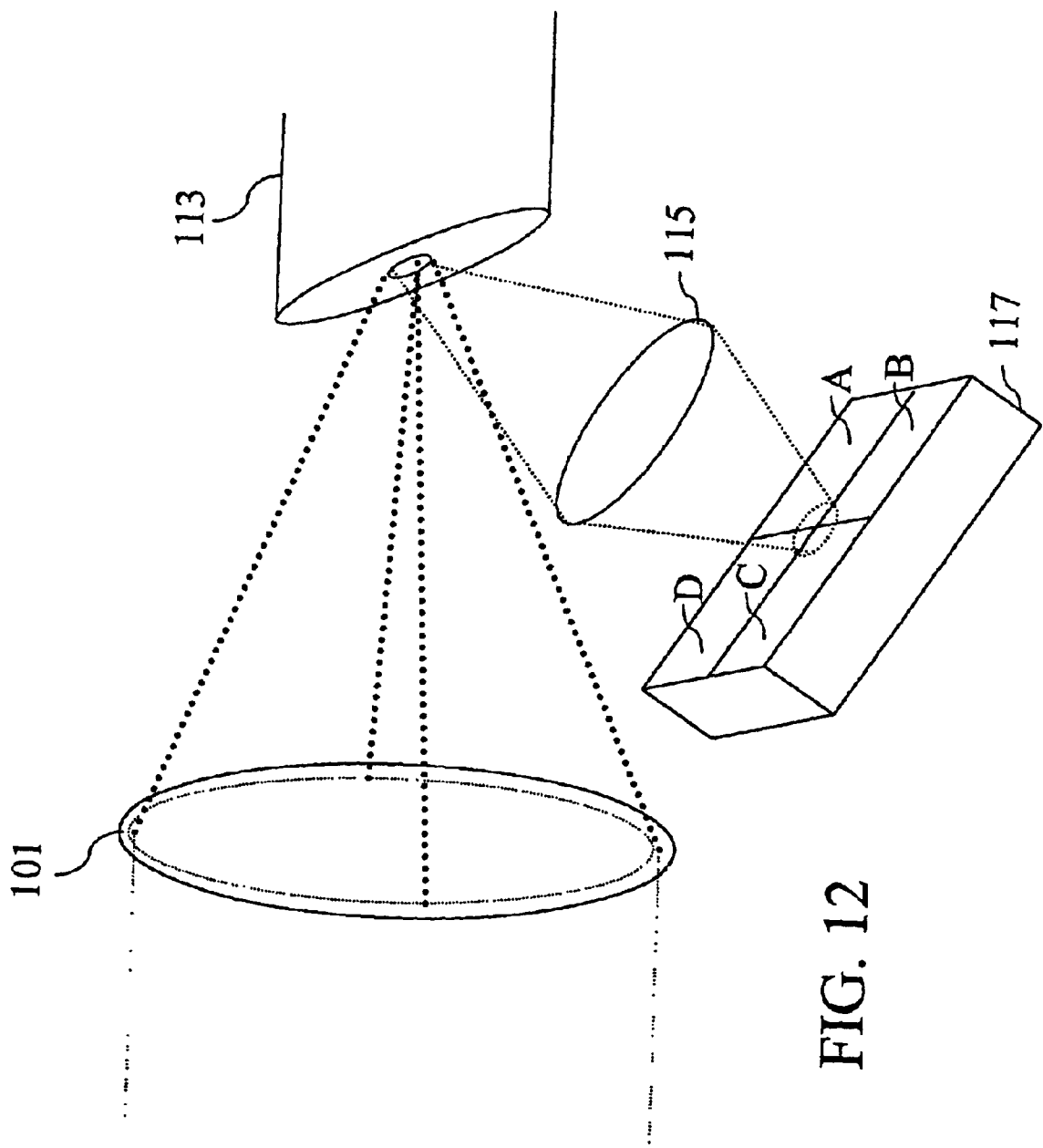
FIG. 12 illustrates one embodiment of a control system using an angle cleaved fiber and capable of controlling various embodiments of an optical transmission apparatus.

An alternative approach to using a chiseled lens is shown in FIG. 12. For most fiber coupling applications where minimal feedback is required for both the active component (such as a DFB laser) or for the system, an angle cleaved fiber is used. When the light is focused on the fiber, there is a parasitic reflection from the cleave. The reflection is refocused on a position-sensitive or a quad detector that will produce an error signal. Like the previous embodiment shown in FIG. 11, the relative ratios of light on the detectors, or the signal corresponding to the position can be stored as an initial calibration. Any offset from the initial calibration is detected by the electronics and fed back into the control loop. In FIG. 12, light is focused by lens 101 onto the facet of an angle cleaved fiber 113. The image on the cleave is then refocused by a second lens 115 onto a quad detector 117. This generates photocurrent in the four sections, labeled A, B, C, and D. The ratio of these currents are stored and used for maintaining alignment, as previously described with reference to the photodetectors in FIG. 11.

If the quad or position-sensitive detector is placed very close to the fiber, then the second refocusing lens 115 can be eliminated, as any shift in the position of the image on the fiber will translate to varying detected powers on the photodetector. The same concept can be applied to coupling to other structures. For example, when coupling a laser to a lithium niobate chip, the position of the reflection from the facet can also be monitored.

Figure 13:
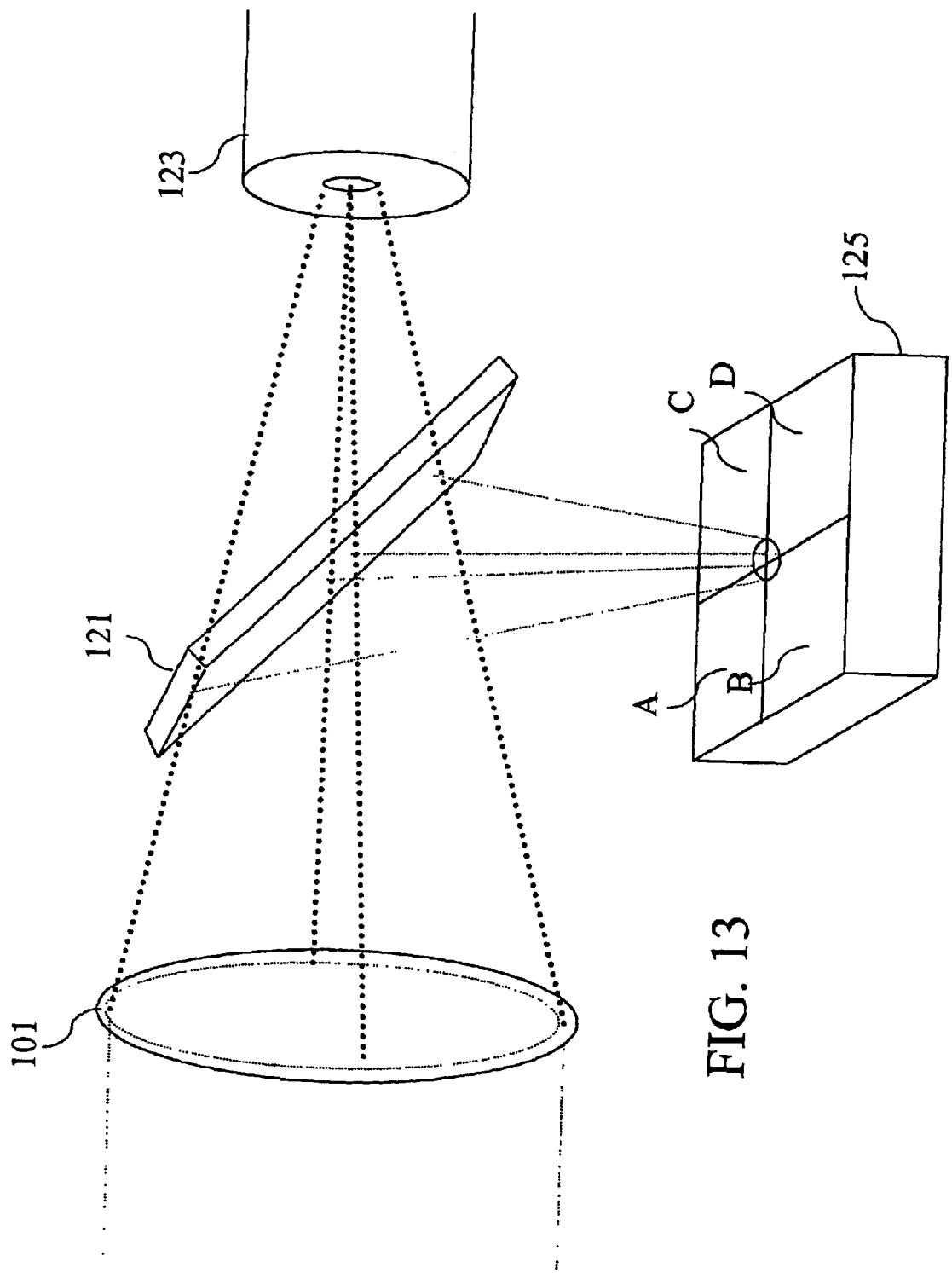
FIG. 13 illustrates one embodiment of a control system using a beam splitter and capable of controlling various embodiments of an optical transmission apparatus.

In one embodiment, a beam splitter is placed before the optical fiber to independently generate a second image. This is shown schematically in FIG. 13. The focusing lens 101 images light onto the end face of a fiber 123. Between the lens and the fiber is a beamsplitter 121, which forms a secondary image on a quad or position-sensitive detector 125. Once again, the ratio of generated photocurrent in the detectors is stored during an initial calibration process, and an electronic feedback system maintains this ratio continuously during the operation of the device.

Figure 14:
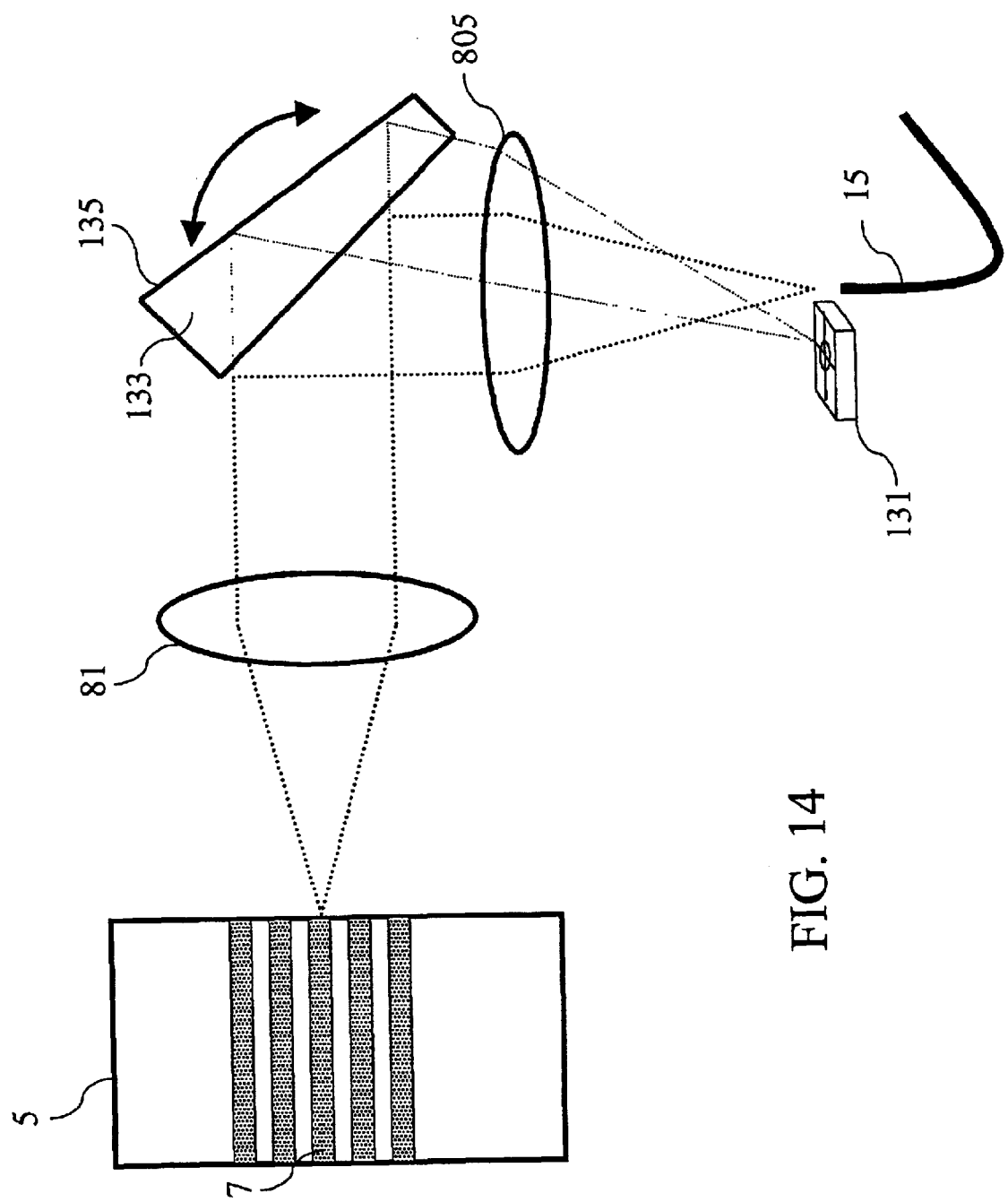
FIG. 14 illustrates one embodiment of a control system using parasitic reflectivity and capable of controlling various embodiments of an optical transmission apparatus.

In general, any optical system will have a set of parasitic reflections, and these can also be used to maintain optimal coupling to the fiber. FIG. 14 shows that a reflection from the back side of the movable mirror forms a secondary image next to the fiber if the mirror is not perfectly parallel. One could also consider the front side reflection as parasitic, and the backside reflection as the main beam, depending on how the mirror is coated. The light beam from the laser element 7 via lens 81 reflects both from a front face of the mirror 133 and also from a back face 135. The image from the front face is focused on a fiber 15 via lens 805, while the image form the back face will occur slightly displaced from the main image. A quad or position-sensitive detector 131 is placed at this secondary image to lock the main image on the fiber, as previously described. In various other embodiments, other parasitic images are used, such as a reflection from other optical elements, for example, the exit window at one end of the package, or the light transmitted through the mirror which shifts as a function of mirror position.

Figure 15:
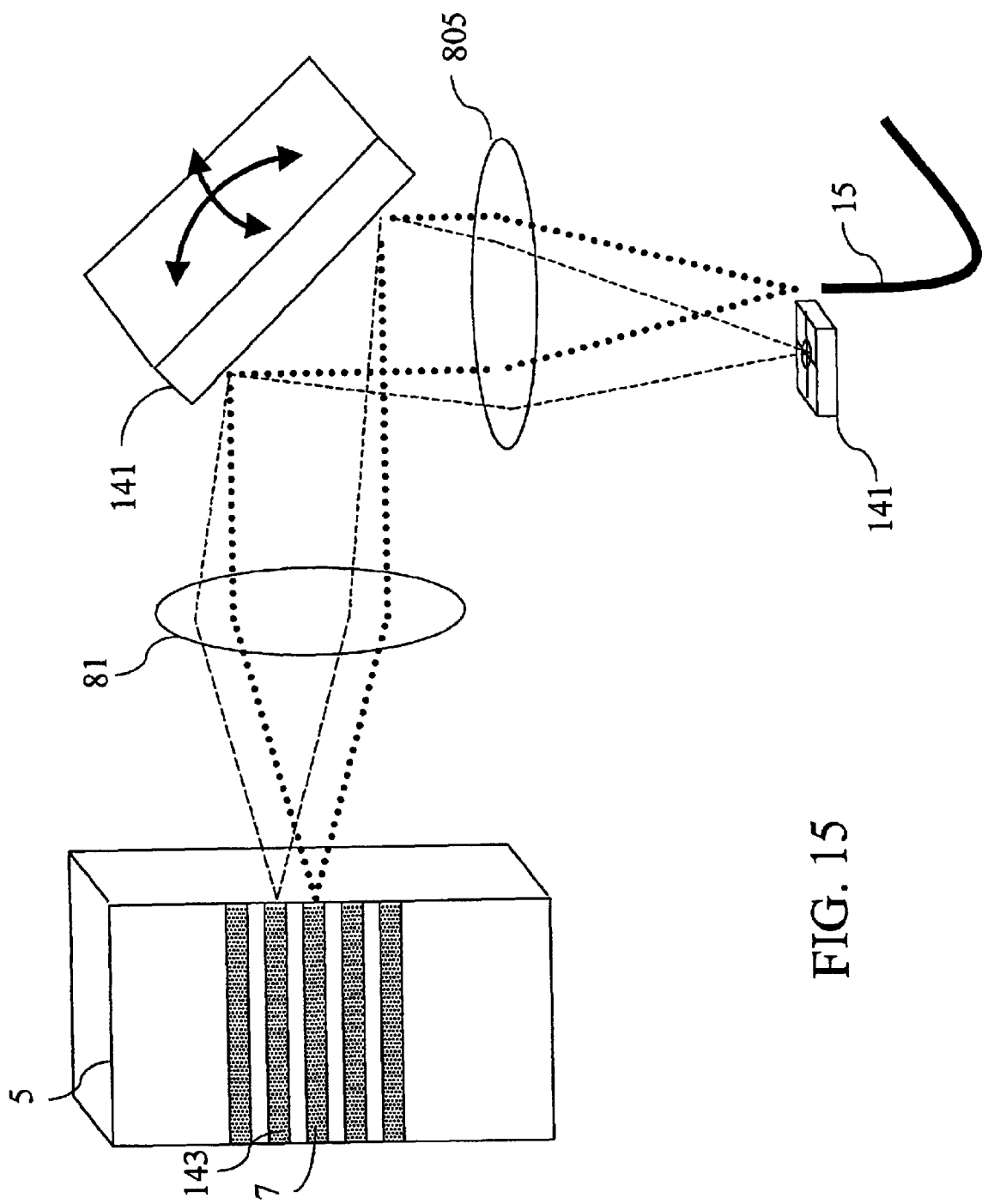
FIG. 15 illustrates one embodiment of a control system using a guide laser and capable of controlling various embodiments of an optical transmission apparatus.

For optical systems with laser arrays, as described in the figures, whenever a particular laser needs to be coupled to the fiber, the laser on one side of the active device is also activated, though perhaps at a lower output power. This adjacent laser source produces an adjacent image next to the fiber core. The relative position depends on the spacing in the array and the magnification of the optical system. Since the beam from this laser is not needed in the fiber, a quad detector or a position-sensitive detector is used to detect the position of the adjacent image. As previously described, an error signal is generated by measuring the ratio of photocurrents in the quad detector. However, in using this technique, an additional laser is utilized and extra power is consumed for this additional "guide" laser. This embodiment is described in further detail in reference to FIG. 15.

The multi-element laser array 5 contains lasers of different characteristics. A particular laser, e.g., laser element 2, is selected to be coupled into the fiber 15. An adjacent laser, e.g., laser element 143, is also activated, and the beam from the adjacent laser propagates through the optical system, i.e., via lens 81, mirror 145, and lens 805, and is focused adjacent to the fiber. A position sensitive detector 141 detects the location of the adjacent image or guiding spot to generate the error or feedback signal. In other embodiments, instead of the adjacent laser being used, others lasers, a given distance away from the selected laser, are used. Using a larger separation between the "active" laser and the "guide" laser can be helpful, as the image is further from the fiber core and thus easier to capture from a photodetector. However, a number of lasers on the chip may be required. For example, if twelve lasers are used and a third laser away from a selected laser along one direction of the laser array is used to monitor the fiber coupling, then fifteen lasers in total would be used on the chip.

Accordingly, the present invention provides a system and methodology for controlling fiber coupling between tunable lasers and an optical output to maximize fiber coupled power. Although this invention has been described in certain specific embodiments, many additional modifications and variations would be apparent to one skilled in the art. It is therefore to be understood that this invention may be practiced otherwise than is specifically described. Thus, the present embodiments of the invention should be considered in all respects as illustrative and not restrictive. The scope of the invention to be indicated by the appended claims, their equivalents, and claims supported by this specification rather than the foregoing description.

What is claimed is:

1. An optical transmission control apparatus comprising:
   an array of lasers;
   at least one optical element;
   an optical output, such that light from a laser from the array of lasers is directed into the optical output by the at least one optical element;
   a controller coupled to the at least one optical element and configured to adjust the at least one optical element to maximize output power of the light directed into the optical output; and
   a detector proximate the optical output and having a plurality of regions and configured to measure output power of light emitted from a selected laser that strikes each region.

2. The apparatus of claim 1 wherein the controller is configured to adjust the at least one optical element based on the output power measured at each region.

3. An optical transmission control apparatus comprising:
   an array of lasers;
   at least one optical element;
   an optical output, such that light from a laser from the array of lasers is directed into the optical output by the at least one optical element;
   a controller coupled to the at least one optical element and configured to adjust the at least one optical element to maximize output power of the light directed into the optical output; and
   a detector proximate the optical output and having a plurality of regions and configured to determine locations of light emitted from a selected laser that strikes the plurality of regions.

4. The apparatus of claim 3 wherein the controller is configured to adjust the at least one optical element based on the determined locations of light.

5. An optical transmission control apparatus comprising:
   an array of lasers having lasers configured to unit light;

an optical output configured to receive light;

a detector near the optical output;

at least one optical element configured to receive light from a laser from the array of lasers and to direct a portion of the light to the optical output and a portion of the light to the detector; and a controller being coupled to the at least one optical element and configured to adjust the at least one optical element to maximize output power of the light directed into the optical output.

6. The apparatus of claim 5 wherein the controller is coupled to the detector and is configured to adjust the at least one optical element based on location of the portion of light incident upon the detector.

7. The apparatus of claim 5 wherein the controller is coupled to the detector and is configured to adjust the at least one optical element based on optical power of the portion of light measured by the detector.

8. The apparatus of claim 5 wherein the portion of light directed to optical output has a greater optical power then the portion of the light directed to the detector.

9. The apparatus of claim 5 wherein the at least one optical element comprises a beam splitter.

10. An optical transmission control apparatus comprising:

emitting means for emitting light having different wavelengths;

output means;

optical means for directing light having a particular wavelength from the emitting means into the output means; and control means coupled to the optical means and for adjusting the optical means to maximize output power of the light directed into the output means;

sensing means for sensing light and is proximate the output means;

wherein the control means is coupled to the sensing means and adjusts the optical means based on light sensed by the sensing means; and wherein the optical means directs a portion of light from the emitting means to the sensing means.

11. The apparatus of claim 10 wherein the control means is coupled to the sensing means and adjusts the optical means based on location of the portion of light incident upon the sensing means.

12. The apparatus of claim 10 the control means is coupled to the sensing means and adjusts the optical means based on optical power of the portion of light measured by the sensing means.

13. The apparatus of claim 10 wherein the optical means comprises a beam splitter.

* * * * *